(12) United States Patent
Iwabuchi et al.

(10) Patent No.: US 8,822,128 B2
(45) Date of Patent: Sep. 2, 2014

(54) PRODUCTION METHOD OF RESIST COMPOSITION FOR LITHOGRAPHY

(75) Inventors: Motoaki Iwabuchi, Jyoetsu (JP); Tsutomu Ogihara, Jyoetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 52 days.

(21) Appl. No.: 13/604,270

(22) Filed: Sep. 5, 2012

(65) Prior Publication Data
US 2013/0108957 A1    May 2, 2013

(30) Foreign Application Priority Data

Oct. 26, 2011 (JP) ................................. 2011-234598

(51) Int. Cl.
*G03F 7/004* (2006.01)
*B01D 37/02* (2006.01)
*G03F 7/075* (2006.01)

(52) U.S. Cl.
CPC .............. *G03F 7/004* (2013.01); *B01D 37/025* (2013.01); *G03F 7/075* (2013.01)
USPC .......................... 430/270.1; 430/327; 210/651

(58) Field of Classification Search
CPC ........... G03F 7/004; G03F 7/38; B01D 15/20; B01D 15/206; B01D 37/02; B01D 37/025; B01D 39/04; B01D 39/06

USPC ............ 430/270.1, 327; 210/502.1, 636, 650, 210/651, 663, 767
See application file for complete search history.

(56) References Cited

U.S. PATENT DOCUMENTS 6,103,122 A * 8/2000 Hou et al. .................. 210/502.1
7,264,728 B2 * 9/2007 Gibson et al. ................. 210/638

FOREIGN PATENT DOCUMENTS

EP          0 062 527 A2 * 10/1982
JP       A-2002-62667        2/2002

* cited by examiner

*Primary Examiner* — Anca Eoff
(74) *Attorney, Agent, or Firm* — Oliff PLC

(57) ABSTRACT

The present invention provides a production method of a resist composition for lithography, comprising, at least: a filtering step for filtering a resist composition for lithography by a filter therethrough, wherein in the filtering step, a colloidal, sol is passed through the filter from upstream thereof to adsorb colloidal particles to the filter, and then the resist composition for lithography is passed through the filter, thereby removing fine particles in the resist composition for lithography therefrom. There can be provided a resist composition for lithography capable of decreasing occurrences of defects such as coating defects and pattern defects.

2 Claims, 1 Drawing Sheet

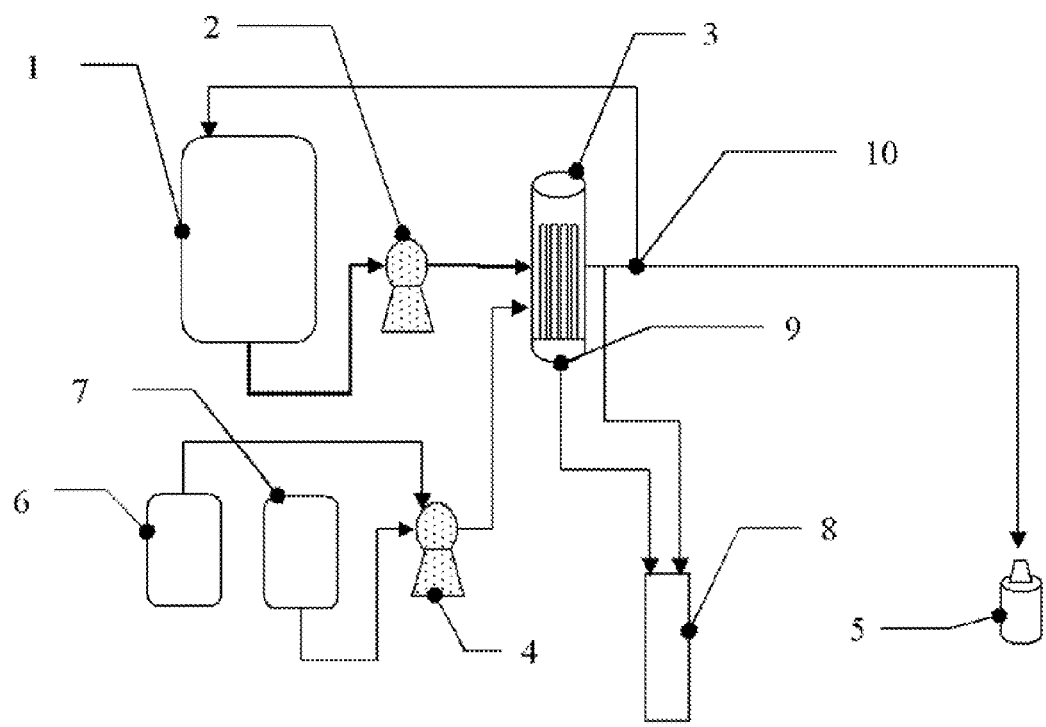

PRODUCTION METHOD OF RESIST COMPOSITION FOR LITHOGRAPHY

BACKGROUND OF THE INVENTION

1. Field of the Invention

The present invention relates to a production method of a resist composition for lithography, and specifically to a production method of a resist composition for lithography capable of decreasing occurrences of defects such as coating defects and pattern defects.

2. Description of the Related Art

With enhanced integration degrees and increased speeds of LSI's, miniaturization of pattern sizes is being rapidly progressed. The lithography technique has achieved formation of finer patterns, by appropriately adopting a light source having a shorter wavelength and a resist composition suitable therefor, in step with such a scaling down. Along this trend, resins to be used for photoresist compositions have been required to be low in light absorption at exposure wavelengths, respectively, resulting in a transition of resins from a novolak resin through polyhydroxystyrene to a resin having an aliphatic polycyclic structure along with a progressive transition of exposure light from i-line through KrF to ArF.

Further, in case of scaling down using the same light source in a manner to achieve the scaling down while keeping a thickness of an adopted photoresist film as it is, i.e.; in a manner to merely narrow pattern line widths, the photoresist pattern after development is increased in aspect ratio of line profile, thereby resultingly causing a pattern collapse. Thus, along with the scaling down, photoresist films have been decreased in thickness such that aspect ratios of line profiles of photoresist patterns are kept in appropriate ranges, respectively.

Meanwhile, for processing a substrate to be processed, such a method is typically adopted to use a patterned photoresist film as an etching mask, in a manner to process the substrate to be processed by dry etching. This means that substrates to be processed are required to be dry etched by using photoresist films each made to be thinner and thus weaker in etching resistance due to the above circumstances, thereby requiring to promptly ensure obtainment of a material and the like to be used in such a processing step.

Examples of methods for solving such a problem include a multi-layer resist method. This method is configured to: place a resist lower layer film between a photoresist film, i.e., resist upper layer film, and a substrate to be processed, the resist lower layer film having an etching selectivity different from that of the resist upper layer film; obtain a pattern in the resist upper layer film; subsequently transfer the pattern into the lower layer film by dry etching, by using the upper resist pattern as a dry etching mask; and transfer the pattern info the substrate to be processed by dry etching, by using the lower layer film as a dry etching mask.

In this way, resist compositions to be used in a lithography process have been decreased in film thickness and increased in the number of layers, in forming fine patterns. Then, coated films to be formed from compositions to be used at this time axe decreased in film thickness, so that even minute defects tend to affect a yield of a process.

To decrease such defects, it has been exemplarily attempted to filter a photoresist composition by using a filter, thereby removing fine particles acting as a cause of defects in the photoresist composition therefrom (see Japanese Patent Laid-Open (kokai) No. 2002-062667, for example).

SUMMARY OF THE INVENTION

However, it has been revealed that those finer particles are existent which can not be caught by a commercially available fine pore filter, and which are turned into foreign matter defects upon formation of a coated resist film.

The present invention has been carried out in view of the above problems, and it is therefore an object of the present invention to provide a production method of a resist composition for lithography capable of decreasing occurrences of defects such as coating defects and pattern defects.

To solve the problems mentioned above, the present invention provides a production method of a resist composition for lithography, comprising, at least:

a filtering step for filtering a resist composition for lithography by a filter therethrough, wherein in the filtering step, a colloidal sol is passed through the filter from upstream thereof to adsorb colloidal particles to the filter, and then the resist composition for lithography is passed through the filter, thereby removing fine particles in the resist composition for lithography therefrom.

According to such a production method, it is enabled to expediently remove fine particles in a resist composition for lithography. Thus, it is enabled to decrease occurrences of defects such as coating defects and pattern defects, by adopting the composition produced by the production method of the present invention to form a coated film, pattern, or the like.

In addition, it is preferable that the method is configured to use, as the colloidal sol, a colloidal silica comprising silanes including a tetraaikoxy silane.

Using such a colloidal sol further improves an effect for removing fine particles in the resist composition for lithography.

In addition, the method may be configured to use, as the resist composition for lithography, one of a composition for forming a resist top coat, a photoresist composition, a resist composition for EUV, a resist composition for EB, a composition for forming a silicon-containing resist lower layer film, and a composition for forming an organic resist lower layer film.

In this way, the present invention is utilizable upon production of various known, resist compositions, and is thus useful.

As mentioned above, fine particles in a resist composition for lithography can be collected more assuredly by a simple procedure according to the production method of a resist composition for lithography of the present invention, and the coated, film formed by coating the composition obtained by this production method is capable of restricting occurrences of defects caused by fine particles. This also improves a yield of a production process.

Further, according to such a method, it is unrequired to prepare an additional expensive apparatus, a specific part, and the like, thereby also enabling to restrict a production cost.

BRIEF DESCRIPTION OF THE ACCOMPANYING DRAWINGS

FIG. 1 is a drawing which shows an example of an apparatus to be used in the production method of the present invention.

DETAILED DESCRIPTION OF THE PREFERRED EMBODIMENTS

The present invention will be explained hereinafter, without limited thereto.

As resist compositions to be used in a lithography process have been decreased in film thickness and increased in the number of layers as described above, that affection on a yield of a process which is to be brought about by defects also has been made progressively serious.

The present inventors have conducted investigation of such defects, and found out that those finer particles are existent which can not be caught by a commercially available fine pore filter, and which are turned into foreign matter defects upon formation of a coated resist film in a manner to cause a lower yield. Thus, the present inventors have earnestly conducted a further investigation so as to solve the above problem by improving a filter, and resultingly found out a possibility of provision of a method configured to pass a colloidal sol through a filter from upstream thereof in a manner to adsorb colloidal particles to the filter so as to remove fine particles in a resist composition for lithography therefrom, thereby obtaining a coated film from the filtered resist composition containing a smaller number of fine particles, to narrowly complete the present invention.

The present invention will be explained hereinafter in more detail.

The present invention resides in a production method of a resist composition for lithography, comprising, at least:

a filtering step for filtering a resist composition for lithography by a filter therethrough, wherein in the filtering step, a colloidal sol is passed through the filter from upstream thereof to adsorb colloidal particles to the filter, and then the resist composition for lithography is passed through the filter, thereby removing fine particles in the resist composition for lithography therefrom.

Although scaling down of pore diameters of filters also has been conventionally progressed so as to remove fine particles in a composition therefrom to thereby decrease defects, such a progression is not easy because of a required precise processing in an order of nm unit. Further, excessively decreased pore diameters rather cause another problem that the time for filtration is prolonged to deteriorate the productivity.

Nonetheless, according to the production method of the present invention, if is enabled to readily and assuredly produce a resist composition for lithography from which fine particles have been removed without such a precise processing.

The production method of the present invention is also usable upon production of any one of known resist compositions, and examples of the resist compositions for lithography in this case include: a composition for forming a resist top coat to be used in a liquid immersion exposure process; a composition (a photoresist composition, a resist composition for EUV, a resist composition for EB, or the like) for forming a resist film of a type sensitive to a high energy beam, to be used in case of conducting exposure by UV light, excimer laser, X-rays, electron beam, or the like; a composition for forming a silicon-containing resist lower layer film; a composition for forming an organic resist lower layer film; and the like.

Although it is possible to adopt, as the filter to be used then, an arbitrary one insofar as colloidal particles in a colloidal sol (colloidal solution) can be caught by it, adoption of a filter having a nominal fine pore diameter in a range of 1 nm to 1,000 nm allows for collection of colloidal particles in the colloidal sol with a good efficiency. Examples thereof specifically include a filter, which has a nominal fine pore diameter in a range of 1 nm to 100 nm, and which is to be used for precise filtration of a resist composition for lithography.

Particularly, those filters are preferable which are made of materials such as polyethylene, polypropylene, fluororesins, polyamide-based resins, and the like, and exemplary forms thereof include a pleat type, a hollow fiber type, a yarn type, a depth type, a membrane type, and the like.

It is possible to adopt, as the colloidal sol to be provided in the present invention and passed through a filter from upstream thereof, an arbitrary one insofar as the same is prepared by known means, and examples thereof specifically include: an aqueous colloidal sol obtainable by polymerising a metal alkoxide or metal, hydroxide in water, for example, a sol comprising silica, titania, zirconia, ceria, alumina, antimony pentoxide, or calcium carbonate; a sol comprising an organic resin such as polyvinyl chloride and polyacrylate; and the like.

Among them, inorganic sols are preferable which are insoluble in an organic solvent for a resist composition for lithography, and a colloidal silica comprising silanes including a tetraalkoxy silane is particularly preferable, because the colloidal silica is capable of improving an effect for removing fine particles in the resist composition for lithography, and because the colloidal silica is easy to produce.

It is enough for colloidal particles in the colloidal sol to have diameters in a range of 0.1 to 1,000 nm, and preferably diameters of 100 nm or larger which can be collected by a "filter having a nominal fine pore diameter in a range of 1 nm to 100 nm" to be used for precise filtration of a resist composition for lithography.

Although it is possible to directly use a colloidal sol in a prepared state, it is also possible to adopt a liquid to dilutingly prepare the colloidal sol for the exemplary purpose of uniformly adsorb colloidal particles to a filter. Preferable as such a liquid to be used for dilution, is water which is excellent in dispersability of an inorganic sol therein.

Next, the embodiment of the present invention will be explained with reference to the drawing.

FIG. 1 shows an example of an apparatus to be used in the production method of the present invention. This apparatus is constituted of a tank 1 (for resist composition for lithography), a tank 6 (for colloidal sol), a tank 7 (for cleaning solvent), a liquid feeding pump 2 (for resist composition for lithography), a liquid feeding pump 4 (for colloidal sol and cleaning solvent), a filter vessel 3, a drain 8, pipings (including pipings not shown in the FIGURE) and valves (including valves not shown in the FIGURE) accompanying to the previous elements, and the like.

As a preparatory step of the filtering step, a filter to be used for filtration of a resist composition is set inside the filter vessel 3, and then the pipings between the filter vessel 3 and the liquid feeding pump 2 and between the former and the filling container 5 are shut off by closing the valves therein, respectively.

Firstly, the liquid feeding pump 4 is used to feed the colloidal sol in the tank 6 to the filter vessel 3, to pass the colloidal sol through the filter from upstream thereof, thereby adsorbing colloidal particles to the filter. This operation may be of course conducted, while opening a valve in that piping which is placed downstream of the filter vessel 3 and which is communicated with the drain 8 (i.e., in a so-called free-discharging state). However, it is possible to adsorb colloidal particles to the filter in a more efficient manner, by opening the above noted valve after the interior of the filter vessel 3 is brought into a state filled with the fed colloidal sol, in a manner to exhaust the colloidal sol toward the drain 8 (hereinafter, that solution which is to be exhausted toward the drain 8 is expediently called "filtrate"). Further, it is economically preferable that the filtrate is returned from the drain 8 to the tank 6 to thereby conduct circulating filtration.

It is preferable at this time to feed the colloidal sol at a flow rate of 100 to 1,000 g/min per 1 $m^2$ of filter area, for example.

It is preferable to subsequently conduct an operation to use the liquid feeding pump 4 to feed the cleaning solvent in the tank 7 to pass it through the filter from upstream thereof, in a manner to clean the colloidal particles adsorbed to the filter, and to simultaneously wash away those colloidal particles which have not been adsorbed to the filter, thereby exhausting such colloidal particles from the exhaust valve 9 of the filter vessel 3 toward the drain 8. Also in this case, it is possible to conduct the circulating filtration in the same manner as the above.

Preferably usable as the cleaning solvent is pure water.

Further, it is also possible to conduct the circulating filtration by adopting a main solvent of the resist composition for lithography to be filtered later.

Next, the resist composition for lithography in the tank 1 is passed through the filter vessel 3.

In this way, fine particles in the resist composition for lithography are adsorbed to the colloidal particles having been adsorbed to the filter, thereby enabling to remove the fine particles from the composition.

This operation can foe exemplary conducted by a circulating filtration configured to: open the valve under the tank 1 containing the resist composition for lithography charged therein, to fill the associated piping with the composition in the appropriate manner; subsequently actuate the liquid feeding pump 2 to feed the liquid to the filter vessel 3/thereby bringing it into a state filled with the fed liquid; and then open the secondary side valve 10 of the filter vessel 3, thereby allowing the fed liquid to return into the tank 1.

Finally, it is enough to change over the applicable valve to fill the resist composition for lithography into the product container 5, once the number of fine particles in the fed liquid (i.e., resist composition for lithography) is determined to be a predetermined value or lower (i.e., once the number of fine particles is made to be substantially constant in fluctuation), based on a liquid-borne particle counter (not shown).

Although the circulating path of the colloidal sol in FIG. 1 has been shown as a path separate from the filtering path of the resist composition for lithography, the present invention is not limited thereto, and it is also possible to use only the tank 1 instead of the tank 6 and tank 7, in a manner to conduct the filtering step by using only the tank 1, the liquid feeding pump 2, the filter vessel 3, and the drain 8, for example. Only, it is required in this case to firstly fill the tank 1 with the colloidal sol.

EXAMPLES

Although the present invention will be explained hereinafter in more detail by describing Examples, the present invention is not limited to these Examples.

Production Example

Mounted onto a separable cylindrical 3 L flask having a diameter of 10 cm and provided with a temperature adjusting jacket, were a stirrer and stirring vanes. Charged thereinto were 26 g of 29% ammonia water, 21 g of ion exchange water, and 326 g of methanol, followed by circulation of warm water through the jacket while stirring and keeping the interior temperature at 35° C. Dropped thereinto were 218 g of 5.4% ammonia water and 608 g of tetramethoxysilane over 10 hours, from two directions by using pumps, respectively. After completion of the dropping, stirring and warm water circulation were stopped, to obtain a silica sol (colloidal silica solution) in an amount of 1,063 g. The thus obtained solution contained a solid content in an amount of 205 g, and its particle size distribution was from 100 to 150 nm as a result of particle size distribution measurement by a centrifugal precipitation method.

Example

The apparatus shown in FIG. 1 was used. Firstly set into the filter vessel 3 was a cartridge filter made of polyethylene (nominal fine pore diameter of 5 nm, and filtration area of 1.1 square meters), followed by shutting of pipings between the liquid feeding pump 2 and filter vessel 3 and between the latter and the filling container 5, by valve closure.

Fed into the filter vessel in such a state was a solution at a flow rate of 400 g/min by using the liquid feeding pump 4 where the solution was charged in the tank 6 after dilutingly preparing 68 g of the colloidal silica solution obtained in the Production Example by 10 kg of pure water, thereby bringing the interior of the filter vessel 3 into a state filled with the fed solution. Thereafter, the valve of the piping positioned downstream of the filter vessel 3 and leading to the drain 8, was opened such that the filtrate was caused to return from the drain 8 into the tank 6, thereby conducting circulating filtration. At this time, the number of particles of 0.15 µm or larger in the filtrate was measured to be three per 10 mL, based on the liquid-borne particle counter.

After exhausting the liquid in the filter vessel 3, the liquid feeding pump 4 was used, to feed 10 kg of pure water charged in the tank 7 to bring the interior of the filter vessel 3 into a state filled with the fed water, and then the exhaust valve 9 of the filter vessel 3 was opened to conduct circulating filtration such that the filtrate was returned from the drain 8 into the tank 7, followed by exhaustion of the liquid in the filter vessel 3 and the pure wafer in the tank 7.

Next, charged into the tank 7 was 10 L of a main solvent of a composition for forming a silicon-containing resist lower layer film, then the liquid, feeding pump 4 was used to bring the interior of the filter vessel 3 into a state filled with the fed liquid, and thereafter the exhaust valve 9 was opened to conduct circulating filtration in a manner to return the filtrate from the drain 3 into the tank 7.

Subsequently opened was a valve under the tank 1 containing the composition for forming a silicon-containing resist lower layer film therein to thereby fill the associated piping with the composition; the liquid feeding pump 2 was then actuated to feed the liquid to bring the interior of the filter vessel 3 into a state filled with the fed liquid; the secondary side valve 10 of the filter vessel 3 was thereafter opened to conduct circulating filtration in a manner to return the filtrate info the tank 1; and then the valve was changed over to fill the product container 5 with the composition, once the number of fine particles in the liquid was determined to be a predetermined value or smaller (i.e., once the number of fine particles was made to be substantially constant in fluctuation), based on the liquid-borne particle counter.

This product container was connected to Clean Track ACT12 manufactured by Tokyo Electron Ltd., thereby forming a coated film on a silicon substrate having a diameter of 300 mm. This coated film was inspected by Defect Inspection Equipment manufactured by KLA-Tencor Corporation, to measure the number of coating defects. As a result, defects of 0.12 µm or larger were 25 in number, which was a level substantially free of problem.

Comparative Example

Filled into the product container 5 was the composition for forming a silicon-containing resist lower layer film in entirely the same procedure as the Example, except for omission of the procedures for conducting the circulating filtration using the colloidal silica solution (i.e., operation for adsorbing colloidal particles of the colloidal silica to the filter) and for conducting the cleaning by pure wafer.

This product container was connected to Clean Track ACT12 manufactured by Tokyo Electron Ltd., thereby forming a coated film on a silicon substrate having a diameter of 300 mm. This coated film was inspected by Defect Inspection Equipment manufactured by KLA-Tencor Corporation, to measure the number of coating defects. As a result, defects of 0.12 µm or larger were 290 in number.

From the results of the Example and Comparative Example, it was confirmed that the coated film formed by coating the composition obtained by the production method of a resist composition for lithography of the present invention was capable of restricting defects caused by fine particles. This means that it has been proven that fine particles in a resist composition for lithography can be collected more assuredly by a simple procedure according to the production method of a resist composition for lithography of the present invention.

It is to be noted that the present invention is not limited to the above embodiments. The above embodiments are merely illustrative, and whatever having the substantially same configurations as the technical concept recited in the appended claims and exhibiting the same functions and effects are embraced within the technical scope of the present invention.

What is claimed is:

1. A production method of a resist composition for lithography, comprising filtering a resist composition for lithography through a filter,
    wherein the filtering comprises
        passing a colloidal sol through the filter from upstream thereof to adsorb colloidal particles to the filter, and then
        passing the resist composition for lithography through the filter, thereby removing fine particles from the resist composition for lithography, and
    wherein a colloidal silica comprising tetralkoxy-silane is used as the colloidal sol.

2. The production method of a resist composition for lithography according to claim 1, wherein the resist composition for lithography is one of a composition for forming a resist top coat, a photoresist composition, a resist composition for EUV, a resist composition for EB, a composition for forming a silicon-containing resist lower layer film, and a composition for forming an organic resist lower layer film.

* * * * *